US007572569B2

(12) United States Patent  
Iftime et al.

(10) Patent No.: US 7,572,569 B2  
(45) Date of Patent: Aug. 11, 2009

(54) INKLESS PRINTING PAPER AND METHOD

(75) Inventors: Gabriel Iftime, Mississauga (CA); Tyler B. Norsten, Oakville (CA); Peter M. Kazmaier, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 215 days.

(21) Appl. No.: 11/762,098

(22) Filed: Jun. 13, 2007

(65) Prior Publication Data

US 2008/0311516 A1  Dec. 18, 2008

(51) Int. Cl.
*G03F 7/00* (2006.01)
*G03F 7/004* (2006.01)

(52) U.S. Cl. .................. 430/270.1; 430/138; 430/332; 430/346; 430/270.15; 430/945

(58) Field of Classification Search .............. 430/270.1, 430/19, 945, 138, 270.15, 332, 346
See application file for complete search history.

(56) References Cited

U.S. PATENT DOCUMENTS

| | | | |
|---|---|---|---|
| 3,825,427 A | 7/1974 | Inoue et al. | |
| 3,877,941 A | 4/1975 | Lohmann | |
| 3,961,948 A | 6/1976 | Saeva | |
| 4,425,161 A | 1/1984 | Shibahashi et al. | |
| 4,598,035 A | 7/1986 | Usami et al. | |
| 4,659,649 A | 4/1987 | Dickinson et al. | |
| 4,931,337 A | 6/1990 | Miyazaki et al. | |
| 5,124,236 A | 6/1992 | Yamaguchi et al. | |
| 5,262,280 A | 11/1993 | Knudsen et al. | |
| 5,376,511 A | 12/1994 | Tatezono et al. | |
| 5,458,874 A | 10/1995 | Pereira et al. | |
| 5,677,107 A | 10/1997 | Neckers | |
| 5,691,100 A | 11/1997 | Kudo et al. | |
| 5,691,395 A * | 11/1997 | Knudsen et al. | ............... 522/31 |
| 5,747,225 A | 5/1998 | Manico et al. | |
| 6,067,185 A | 5/2000 | Albert et al. | |
| 6,103,378 A | 8/2000 | Yao et al. | |
| 6,200,646 B1 | 3/2001 | Neckers et al. | |
| 6,528,221 B2 | 3/2003 | Takezawa et al. | |
| 6,579,662 B1 | 6/2003 | Zheng et al. | |
| 6,680,281 B2 | 1/2004 | Tajiri et al. | |
| 6,761,758 B2 | 7/2004 | Boils-Boissier et al. | |
| 6,866,981 B2 | 3/2005 | Furukawa et al. | |
| 6,867,408 B1 | 3/2005 | Gu et al. | |
| 6,906,118 B2 | 6/2005 | Goodbrand et al. | |
| 7,018,714 B2 | 3/2006 | Kobayashi et al. | |
| 7,057,054 B2 | 6/2006 | Irie et al. | |
| 7,205,088 B2 | 4/2007 | Iftime et al. | |
| 7,214,456 B2 | 5/2007 | Iftime et al. | |
| 7,229,740 B2 | 6/2007 | Iftime et al. | |
| 7,256,921 B2 | 8/2007 | Kumar et al. | |
| 7,332,257 B2 | 2/2008 | Miyako et al. | |
| 7,381,506 B2 | 6/2008 | Iftime et al. | |
| 7,441,887 B2 | 10/2008 | Senga et al. | |
| 2002/0160318 A1 | 10/2002 | Richter et al. | |
| 2003/0130456 A1 | 7/2003 | Kim et al. | |
| 2005/0012998 A1 * | 1/2005 | Kumar et al. | ............... 359/494 |
| 2005/0244744 A1 | 11/2005 | Kazmaier et al. | |
| 2005/0269556 A1 | 12/2005 | Evans et al. | |
| 2006/0001944 A1 | 1/2006 | Chopra et al. | |
| 2006/0222972 A1 | 10/2006 | Chopra et al. | |
| 2006/0222973 A1 | 10/2006 | Iftime et al. | |
| 2006/0236470 A1 | 10/2006 | Sabnis et al. | |
| 2006/0251988 A1 | 11/2006 | Iftime et al. | |
| 2006/0257785 A1 | 11/2006 | Johnson | |
| 2007/0054215 A1 | 3/2007 | Iftime et al. | |
| 2007/0072110 A1 | 3/2007 | Iftime et al. | |
| 2007/0112103 A1 | 5/2007 | Zhou et al. | |

FOREIGN PATENT DOCUMENTS

| | | |
|---|---|---|
| CA | 2 053 094 A1 | 4/1992 |
| EP | 1 367 111 | 12/2003 |
| EP | 1 405 891 | 4/2004 |
| EP | 1 591 829 | 11/2005 |
| EP | 1 591 831 | 11/2005 |
| FR | 2774998 | 8/1999 |
| GB | 2 430 257 | 3/2007 |
| JP | 57-136645 | 8/1982 |
| JP | A-61-175087 | 8/1986 |
| JP | A-5-265129 | 10/1993 |
| JP | A-11-30835 | 2/1999 |
| JP | A-2002-240441 | 8/2002 |
| JP | A-2002-285146 | 10/2002 |
| JP | A-2003-255489 | 9/2003 |

(Continued)

OTHER PUBLICATIONS

M. Irie, "Diarylethense for Memories and Switches," Chem Reviews, 100, pp. 1685-1716 (2000).

Kentaro Morimitsu et al., "Dithienylethenes With a Novel Photochromic Performance," J. Org. Chem., vol. 67, pp. 4574-4578 (2002).

Wojtyk et al., "Effects of metal ion complexation on the spiropyran-merocyanine interconversion: development of a thermally stable photo-switch," J. Chem. Soc. Chem, Comm., pp. 1703-1704, 1998.

"Dolch Introduces World's First Ruggedized Notebook with Integrated Printer" available at http://news.thomasnet.com/fullstory/7005/447, pp. 1-4, Feb. 6, 2002.

(Continued)

*Primary Examiner*—Amanda C. Walke  
(74) *Attorney, Agent, or Firm*—Oliff & Berridge, Plc.

(57) ABSTRACT

An image forming medium includes a substrate and an imaging layer coated on or impregnated into the substrate, where the imaging layer includes a photobase generator and coupling agent. In the image forming medium, irradiation of the imaging layer causes the photobase generator to generate base that reacts with the coupling agent to produce an image.

23 Claims, No Drawings

FOREIGN PATENT DOCUMENTS

| | | |
|---|---|---|
| JP | A-2003-255490 | 9/2003 |
| JP | A-2004-039009 | 2/2004 |
| JP | A-2004-045037 | 2/2004 |
| JP | A-2004-091638 | 3/2004 |
| JP | A-2004-149501 | 5/2004 |
| JP | A-2004-256780 | 9/2004 |
| JP | A-2005-082507 | 3/2005 |
| JP | A-2005-250463 | 9/2005 |
| WO | WO 97/31033 | 8/1997 |
| WO | WO 00/16985 A1 | 3/2000 |
| WO | WO 2006/039130 A1 | 4/2006 |
| WO | WO 2008/043853 A2 | 4/2008 |

OTHER PUBLICATIONS

T. Hirose et al., "Self-Assembly of Photochromic Diarylethenes With Amphiphilic Side Chains: Reversible Thermal and Photochemical Control," J. Org. Chem., 71, pp. 7499-7508 (2006).

T. Norsten et al., "Photoregulation of Fluorescence in a Porphyrinic Dithienylethene Photochrome," J. Am. Chem. Soc., 123(8), pp. 1784-1785 (2001).

Vladimir I. Minkin, "Photo-, Thermo-, Solvato-, and Electrochromic Spiroheterocyclic Compounds," Chemical Reviews, 104, 5, pp. 2751-2776 (2004).

Takayuki Suzuki et al., "Stabilization of the merocyanine form of photochromic compounds in fluoro alcohols is due to a hydrogen bond", Chem. Commun., 2685-2686 (1998).

Ronald F.M. Lange et al., "Supramolecular polymer interactions based on the alternating copolymer of styrene and Maleimide" Macromolecules, 28, 782-783 (1995).

Vladimir I. Minkin et al., "Perimidine spirocyclohexa dienones" in Organic Photochromic and Thermochromic Compounds, VI, Plenum Press, pp. 315-340 (1999).

John Biteau et al., "Photochromism of Spirooxazine-Doped Gels," J. Phys. Chem., 100, 9024-9031 (1996).

Leonard J. Prins et al., "Noncovalent Synthesis Using Hydrogen Bonding," Angew. Chem. Int. Ed., 40, 2382-2426 (2001).

Terry M. Cresp et al., "A Synthesis of αβ-Unsaturated Aldehydes," J. Chem. Soc., Perkin Trans., 1, pp. 37-41 (1974).

Elliot Berman et al., "Photochromic Spiropyrans. 1. The Effect of Substituents on the Rate of Ring Closure," J. Am. Chem. Soc., 81, 5605-5608 (1959).

Sheng-Hua Liu et al., "Synthesis of Negative Photochromic Crowned Spirobenzopyrans," Syn. Commun., 30, 5, 895-902 (2000).

Yu M. Chunaev et al., "Reaction of the Fischer Base With Nitro- and Bromo-Substituted αHydroxycinnamaldehydes," Chem. Heterocycl. Compd., 628-631 (1984).

Kentaro Morimitsu et al., "Thermal Cycloreversion Reaction of a Photochromic Dithienylperfluorocyclopentene with tert-Butoxy Substituents at the Reactive Carbons," The Chemical Society of Japan, 2002, p. 572-573.

Masamitsu Shirai et al., "Photoacid and Photobase Generators: Chemistry and Applications to Polymeric Materials," *Prog. Polym. Sci.* vol. 21, pp. 1-45 (1996).

U.S. Appl. No. 11/762,152, filed Jun. 13, 2007, to Iftime et al.
U.S. Appl. No. 11/762,327, filed Jun. 13, 2007, to Iftime et al.
U.S. Appl. No. 11/762,147, filed Jun. 13, 2007, to Iftime et al.
U.S. Appl. No. 11/762,098, filed Jun. 13, 2007, to Iftime et al.
U.S. Appl. No. 11/762,157, filed Jun. 13, 2007, to Iftime et al.
U.S. Appl. No. 11/762,153, filed Jun. 13, 2007, to Iftime et al.
U.S. Appl. No. 11/762,144, filed Jun. 13, 2007, to Kazmaier et al.
U.S. Appl. No. 11/762,150, filed Jun. 13, 2007, to Norsten et al.
U.S. Appl. No. 11/762,107, filed Jun. 13, 2007, to Iftime et al.
U.S. Appl. No. 11/762,176, filed Jun. 13, 2007, to Norsten et al.
U.S. Appl. No. 11/762,307, filed Jun. 13, 2007, to Norsten et al.
U.S. Appl. No. 11/762,159, filed Jun. 13, 2007, to Kazmaier et al.
U.S. Appl. No. 11/762,311, filed Jun. 13, 2007, to Kazmaier et al.

* cited by examiner

INKLESS PRINTING PAPER AND METHOD

TECHNICAL FIELD

This disclosure is generally directed to a substrate, method, and apparatus for inkless printing on paper. More particularly, in embodiments, this disclosure is directed to an inkless printing substrates, such as inkless printing paper utilizing a composition that is imagable by UV light, such as comprising a photobase generator and a coupling agent, which composition can be dispersed in a polymer as a dry coating onto or into the substrate. The imaged UV light causes the photobase generator to generate a base, such as an amine, which in turn reacts with the coupling agent, such as an aldehyde, to produce a colored image. Other embodiments are directed to an inkless printing methods using the inkless printing substrates, and apparatus and systems for such printing.

CROSS-REFERENCE TO RELATED APPLICATIONS

Disclosed in commonly assigned U.S. patent application Ser. No. 11/123,163, filed May 6, 2005, is an image forming medium, comprising a polymer, a photochromic compound containing chelating groups embedded in the polymer, and a metal salt, wherein molecules of the photochromic compound are chelated by a metal ion from the metal salt.

Disclosed in commonly assigned U.S. patent application Ser. No. 10/835,518, filed Apr. 29, 2004, is an image forming method comprising: (a) providing a reimageable medium comprised of a substrate and a photochromic material, wherein the medium is capable of exhibiting a color contrast and an absence of the color contrast; (b) exposing the medium to an imaging light corresponding to a predetermined image to result in an exposed region and a non-exposed region, wherein the color contrast is present between the exposed region and the non-exposed region to allow a temporary image corresponding to the predetermined image to be visible for a visible time; (c) subjecting the temporary image to an indoor ambient condition for an image erasing time to change the color contrast to the absence of the color contrast to erase the temporary image without using an image erasure device; and (d) optionally repeating procedures (b) and (c) a number of times to result in the medium undergoing a number of additional cycles of temporary image formation and temporary image erasure.

Disclosed in commonly assigned U.S. patent application Ser. No. 10/834,722, filed Apr. 29, 2004, is a reimageable medium comprising: a substrate; and a photochromic material, wherein the medium is capable of exhibiting a color contrast and an absence of the color contrast, wherein the medium has a characteristic that when the medium exhibits the absence of the color contrast and is then exposed to an imaging light corresponding to a predetermined image to result in an exposed region and a non-exposed region, the color contrast is present between the exposed region and the non-exposed region to form a temporary image corresponding to the predetermined image that is visible for a visible time, wherein the medium has a characteristic that when the temporary image is exposed to an indoor ambient condition for an image erasing time, the color contrast changes to the absence of the color contrast to erase the temporary image in all of the following: (i) when the indoor ambient condition includes darkness at ambient temperature, (ii) when the indoor ambient condition includes indoor ambient light at ambient temperature, and (iii) when the indoor ambient condition includes both the darkness at ambient temperature and the indoor ambient light at ambient temperature, and wherein the medium is capable of undergoing multiple cycles of temporary image formation and temporary image erasure.

Disclosed in commonly assigned U.S. patent application Ser. No. 11/220,803, filed Sep. 8, 2005, is an image forming medium, comprising: a substrate; and an imaging layer comprising a photochromic material and a polymer binder coated on said substrate, wherein the photochromic material exhibits a reversible homogeneous-heterogeneous transition between a colorless state and a colored state in the polymer binder.

Disclosed in commonly assigned U.S. patent application Ser. No. 11/220,572, filed Sep. 8, 2005, is an image forming medium, comprising: a substrate; and a mixture comprising a photochromic material and a solvent wherein said mixture is coated on said substrate, wherein the photochromic material exhibits a reversible homogeneous-heterogeneous transition between a colorless state and a colored state in the solvent.

Disclosed in commonly assigned U.S. patent application Ser. No. 11/123,163, filed May 6, 2005, is an image forming medium, comprising a polymer; and a photochromic compound containing chelating groups embedded in the polymer; and a metal salt; wherein molecules of the photochromic compound are chelated by a metal ion from the metal salt.

Disclosed in commonly assigned U.S. patent application Ser. No. 11/093,993, filed Mar. 20, 2005, is a reimageable medium, comprising: a substrate having a first color; a photochromic layer adjacent to the substrate; a liquid crystal layer adjacent to the photochromic layer, wherein the liquid crystal layer includes a liquid crystal composition; and an electric field generating apparatus connected across the liquid crystal layer, wherein the electric field generating apparatus supplies a voltage across the liquid crystal layer.

Disclosed in commonly assigned U.S. patent application Ser. No. 10/834,529, filed Apr. 29, 2004, is a reimageable medium for receiving an imaging light having a predetermined wavelength scope, the medium comprising: a substrate; a photochromic material capable of reversibly converting among a number of different forms, wherein one form has an absorption spectrum that overlaps with the predetermined wavelength scope; and a light absorbing material exhibiting a light absorption band with an absorption peak, wherein the light absorption band overlaps with the absorption spectrum of the one form.

The entire disclosure of the above-mentioned applications are totally incorporated herein by reference.

BACKGROUND

Inkjet printing is a well-established market and process, where images are formed by ejecting droplets of ink in an image-wise manner onto a substrate. Inkjet printers are widely used in home and business environments, and particularly in home environments due to the low cost of the inkjet printers. The inkjet printers generally allow for producing high quality images, ranging from black-and-white text to photographic images, on a ride range of substrates such as standard office paper, transparencies, and photographic paper.

However, despite the low printer costs, the cost of replacement inkjet cartridges can be high, and sometimes higher than the cost of the printer itself. These cartridges must be replaced frequently, and thus replacement costs of the ink cartridges is a primary consumer complaint relating to inkjet printing.

Reducing ink cartridge replacement costs would thus be a significant enhancement to inkjet printing users.

SUMMARY

The present disclosure addresses these and other needs, in embodiments, by providing an image forming medium utilizing a composition that is imagable by UV light, and which comprises a photobase generator and a coupling agent, which composition can be dispersed in a polymer as a dry coating onto or into the substrate. The imaged UV light causes the photobase generator to generate a base, such as an amine, which in turn reacts with the coupling agent, such as an aldehyde, to produce a colored image. The present disclosure in other embodiments provides an inkless printing methods using the inkless printing substrates, and apparatus and systems for such printing.

The present disclosure thereby provides a printing media, method, and printer system for printing images without using ink or toner. The paper media has a special imagable composition and it is printed with UV light. The paper media thus allows image formation using a printer that does not require ink or toner replacement, and instead images the paper using a UV light source, such as a LED.

In an embodiment, the present disclosure provides an image forming medium, comprising
  a substrate; and
  an imaging layer coated on or impregnated into said substrate, wherein the imaging layer comprises:
    a photobase generator, and
    a coupling agent,
  wherein irradiation of the imaging layer causes said photobase generator to generate a base that reacts with the coupling agent to produce an image.

In another embodiment, the present disclosure provides a method of making an image forming medium, comprising applying an imaging layer composition to a substrate, wherein the imaging layer composition comprises:
  a photobase generator, and
  a coupling agent,
  wherein irradiation of the imaging layer composition causes said photobase generator to generate a base that reacts with the coupling agent to produce an image.

In another aspect, the present disclosure provides a method of forming a transient image, comprising:
  providing an image forming medium comprising:
  a substrate; and
  an imaging layer coated on or impregnated into said substrate,
wherein the imaging layer comprises a photobase generator and a coupling agent,
  exposing the image forming medium to UV irradiation in an imagewise manner,
  wherein said UV irradiation causes said photobase generator to generate a base that reacts with the a coupling agent to produce an image.

The imaging method can be conducted, for example, using an imaging system, comprising:
  the image forming medium described above; and
  a printer comprising a UV irradiation source for printing on the image forming medium in an imagewise manner.

DETAILED DESCRIPTION OF EXEMPLARY EMBODIMENTS

Generally, in various exemplary embodiments, there is provided an inkless paper or image forming medium formed using a composition that is imagable by UV light, such as comprising a photobase generator and a coupling agent, which composition can be dispersed in a polymer as a dry coating onto or into the substrate. The imaged UV light causes the photobase generator to generate a base, such as an amine, which in turn reacts with the coupling agent, such as an aldehyde, to produce a colored image. The composition thus exhibits a transition between a clear state and a colored state in the image forming medium. By a colored state, in embodiments, refers to for example, the presence of visible wavelengths; likewise, by a colorless state, in embodiments, refers to for example, the complete or substantial absence of visible wavelengths.

In embodiments, the image forming medium generally comprises an imaging layer coated on or impregnated in a suitable substrate material, or sandwiched between a first and a second substrate material (i.e., a substrate material and an overcoat layer).

The imaging layer can include any suitable material that, when exposed to an activating energy such as ultraviolet light, switches from a first clear state to a second colored state. The color state change in embodiments can be reversed, and thus the image "erased" and the image forming medium returned to a blank state, by various means such as heating the composition to a temperature that reverses the image forming reaction, thus returning the material to its clear state.

In embodiments, any suitable composition can be used for forming the imaging layer. For example, the imaging layer can comprise a photobase generator and a coupling agent, which composition can be dispersed in a polymer as a dry coating onto or into the substrate. In this composition, the imaged UV light causes the photobase generator to generate a base, such as an amine, which in turn reacts with the coupling agent, such as an aldehyde, to produce a colored image. The active imaging materials can be dispersed in any suitable medium for forming the imaging layer, such as being dispersed in a solvent, a solution, a polymer binder, or the like; being chemically bonded to a carrier such as a polymer binder; provided in the form of microencapsulated materials; incorporated in an enclosed matrix to hold the imaging composition in place; and the like. In embodiments, the image forming reaction can be reversible, although many of the combinations of photobase generator and coupling agent, upon reaction, will tend to form permanent images.

Any suitable photobase generator can be used, where the photobase generator is a precursor that generates a base, such as an amine, when exposed to the activating energy such as UV light. In embodiments, the photobase generator produces an amine when exposed to UV light, where the amine is a basic compound having a pH>7.

Various suitable photobase generators are known in the art, and can be used in embodiments herein. Exemplary photobase generators include o-acyloximes, benzoyloxycarbonyl derivatives, photoactive carbamates such as benzyl carbamates and benzoin carbamates, oxime ester compounds like o-carbamoyloximes, ammonium compounds like quaternary ammonium tetraphenyl borate salts, benzoin compounds, dimethoxybenzyl urethane compounds, orthonitrobenzyl urethane compounds, aromatic sulfonamides, alpha-lactams, N-(2-arylethenyl) amides mixtures thereof, and the like. These compounds generally generate amines as bases by being irradiated with an active energy beam such as UV light. A further review of photoacid and photobase generators can be found, for example, in Prog. Polym. Sci. vol. 21, 1-45, 1996, the entire disclosure of which is incorporated herein by reference.

By way of example only, specific suitable organic based photobase generators include, 2-hydroxy-2-phenylacetophenone N-cyclohexyl carbamate (i.e., $C_6H_5C(=O)CH(C_6H_5)OC(=O)NHC_6H_{11}$); o-nitrobenzyl N-cyclohexyl carbamate (i.e., $o-NO_2C_6H_5CH_2C(=O)NHC_6H_{11}$); N-cyclohexyl-2-naphthalene sulfonamide (i.e., $C_{10}H_7SO_2NHC_6H_{11}$); 3,5-dimethoxybenzyl N-cyclohexyl carbamate (i.e., $(CH_3O)_2C_6H_5CH_2C(=O)NHC_6H_{11}$); N-cyclohexyl p-toluene sulfonamide (i.e., $p-CH_3C_6H_5SO_2NHC_6H_{11}$); and dibenzoin isophorone dicarbamate.

An illustrative example of a suitable photobase generator (amine photogeneration) is shown below:

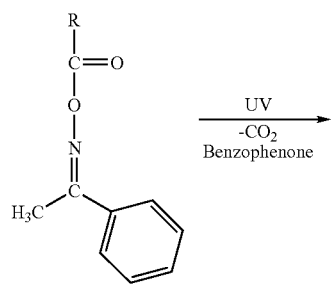

In addition, a suitable photosensitizer may optionally be used in combination with the photobase generator to expand the photosensitize wavelength band of the active energy beam of the photobase generator. Various photosensitizers are well known in the art, and can be used in embodiments. Examples of the photosensitizers include benzophenone, and the like. However, in embodiments, a photosensitizer is desirably omitted, to provide a narrow wavelength band of the active energy beam to help prevent accidental activation of the imaging materials.

Any suitable coupling agent can also be used, where the coupling agent reacts with the base generated from the photobase generator to produce a colored image. In embodiments, the reaction of the a coupling agent with the base generated from the photobase generator causes the image forming layer at the reaction site to change from a clear or colorless state to a colored state, with the degree and/or color of the change being related to the type of materials reacting and the relative amount of material reacting.

Various suitable coupling agents are known in the art, and can be used in embodiments herein. For example, suitable coupling agents are those that can react with the colorless base generated from the photobase generator to form a colored Schiff base compound. This reaction is shown in an exemplary manner as follows:

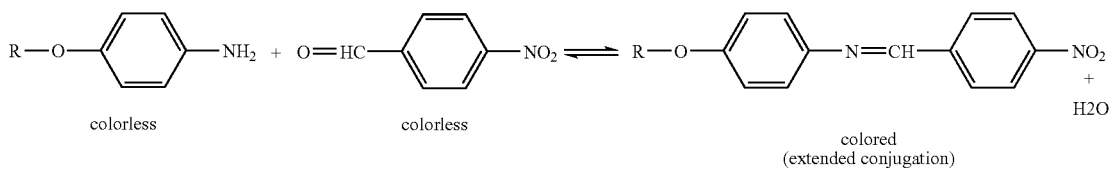

-continued

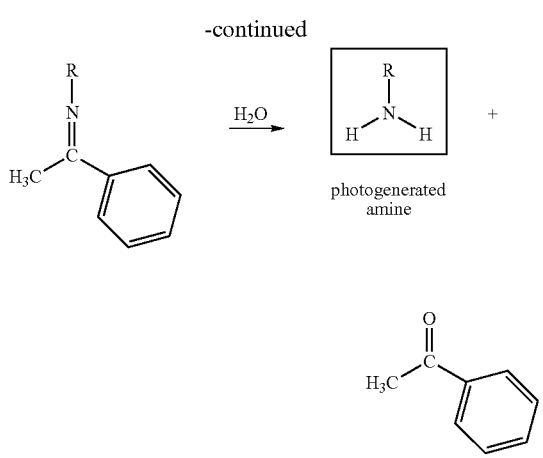

In this depicted process, described in polystyrene films, benzophenone acts as a sensitizer. Water is present in the ambient conditions.

In general, any coupling agent that produces a significant enough color change upon reaction with the generated base is suitable. Exemplary coupling agents include aldehydes, ketones, and mixtures thereof. For example, suitable aldehydes that can be used include adoxal, anisic aldehyde, cymal, ethyl vanillin, florhydral, helional, heliotropin, hydroxycitronellal, koavone, lauric aldehyde, lyral, methyl nonyl acetaldehyde, P. T. bucinal, phenyl acetaldehyde, undecylenic aldehyde, vanillin, 2,6,10-trimethyl-9-undecenal, 3-dodecen-1-al, alpha-n-amyl cinnamic aldehyde, 4-methoxybenzaldehyde, benzaldehyde, 3-(4-tert butylphenyl)-propanal, 2-methyl-3-(para-methoxyphenyl propanal, 2-methyl-4-(2,6,6-trimethyl-2(1)-cyclohexen-1-yl)butanal, 3-phenyl-2-propenal, cis-/trans-3,7-dimethyl-2,6-octadien-1-al, 3,7-dimethyl-6-octen-1-al, [(3,7-dimethyl-6-octenyl)oxy]acetaldehyde, 4-isopropylbenzyaldehyde, 1,2,3,4,5,6,7,8-octahydro-8,8-dimethyl-2-naphthaldehyde, 2,4-dimethyl-3-cyclohexen-1-carboxaldehyde, 2-methyl-3-(isopropylphenyl)propanal, 1-decanal, decyl aldehyde, 2,6-dimethyl-5-heptenal, 4-(tricyclo[5.2.1.0(2,6)]-decylidene-8)-butanal, octahydro-4,7-methano-1H-indenecarboxaldehyde, 3-ethoxy-4-hydroxy benzaldehyde, para-ethyl-alpha,alpha-dimethyl hydrocinnamaldehyde, alpha-methyl-3,4-(methylenedioxy)hydrocinnamaldehyde, 3,4-methylenedioxybenzaldehyde, alpha-n-hexyl cinnamic aldehyde, m-cymene-7-carboxaldehyde, alpha-methyl phenyl acetaldehyde, 7-hydroxy-3,7-dimethyl octanal, Undecenal, 2,4,6-trimethyl-3-cyclohexene-1-carboxaldehyde, 4-(3)(4-methyl-3-pentenyl)-3-cyclohexen-carboxaldehyde, 1-dodecanol, 2,4-dimethyl cyclohexene-3-carboxaldehyde, 4-(4-hydroxy-4-methyl pentyl)-3-cyclohexene-1-carboxaldehyde, 7-methoxy-3,7-dimethyloctan-1-al, 2-methyl undecanol, 2-methyl decanal, 1-nonanal, 1-octanal, 2,6,10-trimethyl-5,9-undecadienal, 2-methyl-3-(4-tertbutyl)propanal, dihydrocinnamic aldehyde, 1-methyl-4-(4-methyl-3-pentenyl)-3-cyclohexene-1-carboxaldehyde, 5 or 6 methoxy0hexahydro-4,7-methanoindan-1 or 2-carboxaldehyde, 3,7-dimethyloctan-1-al, 1-undecanal, 10-undecen-1-al, 4-hydroxy-3-methoxy benzaldehyde, 1-methyl-3-(4-methylpentyl)-3-cyclohexenecarboxaldehyde, 7-hydroxy-3,7-dimethyl-octanal, trans-4-decenal, 2,6-nonadienal, para-tolylacetaldehyde, 4-methylphenylacetaldehyde, 2-methyl-4-(2,6,6-trimethyl-1-cyclohexen-1-yl)-2-butenal, ortho-methoxycinnamic aldehyde, 3,5,6-trimethyl-3-cyclohexene carboxaldehyde, 3,7-dimethyl-2-methylene-6-octenal, phenoxyacetaldehyde, 5,9-dimethyl-4,8-decadienal, peony aldehyde (6,10-dimethyl-3-oxa-5,9-undecadien-1-al), hexahydro-4,7-methanoindan-1-carboxaldehyde, 2-methyl octanal, alpha-methyl-4-(1-methyl ethyl)benzene acetaldehyde, 6,6-dimethyl-2-norpinene-2-propionaldehyde, para methyl phenoxy acetaldehyde, 2-methyl-3-phenyl-2-propen-1-al, 3,5,5-trimethyl hexanal, Hexahydro-8,8-dimethyl-2-naphthaldehyde, 3-propyl-bicyclo[2.2.1]-hept-5-ene-2-carbaldehyde, 9-decenal, 3-methyl-5-phenyl-1-pentanal, methylnonyl acetaldehyde, 1-p-menthene-q-carboxaldehyde, citral, lilial, florhydral, mefloral, and mixtures thereof. Other examples include aromatic aldehydes, such as like 4-nitro-bezaldehyde, 2-nitro-benzaldehyede, 4-methoxy-benzaldhyed etc.

Suitable ketones, including aliphatic ketones, cyclic ketones, aromatic ketones, and the like that can be used include buccoxime, iso jasmine, methyl beta naphthyl ketone, musk indanone, tonalidlmusk plus, Alpha-Damascone, Beta-Damascone, Delta-Damascone, Iso-Damascone, Damascenone, Damarose, Methyl-Dihydrojasmonate, Menthone, Carvone, Camphor, Fenchone, Alpha-Ionone, Beta-Ionone, Gamma-Methyl so-called Ionone, Fleuramone, Dihydrojasmone, Cis-Jasmone, Iso-E-Super, Methyl-Cedrenyl-ketone or Methyl-Cedrylone, Acetophenone, Methyl-Acetophenone, Para-Methoxy-Acetophenone, Methyl-Beta-Naphtyl-Ketone, Benzyl-Acetone, Benzophenone, Para-Hydroxy-Phenyl-Butanone, Celery Ketone or Livescone, 6-Isopropyldecahydro-2-naphtone, Dimethyl-Octenone, Freskomenthe, 4-(1-Ethoxyvinyl)-3,3,5,5,-tetramethyl-Cyclohexanone, Methyl-Heptenone, 2-(2-(4-Methyl-3-cyclohexen-1-yl)propyl)-cyclopentanone, 1-(p-Menthen-6(2)-yl)-1-propanone, 4-(4-Hydroxy-3-methoxyphenyl)-2-butanone, 2-Acetyl-3,3-Dimethyl-Norbornane, 6,7-Dihydro-1,1,2,3,3-Pentamethyl-4(5H)-Indanone, 4-Damascol, Dulcinyl or Cassione, Gelsone, Hexylon, Isocyclemone E, Methyl Cyclocitrone, Methyl-Lavender-Ketone, Orivon, Para-tertiary-Butyl-Cyclohexanone, Verdone, Delphone, Muscone, Neobutenone, Plicatone, Veloutone, 2,4,4,7-Tetramethyl-oct-6-en-3-one, Tetrameran, hedione, 1,4-benzoquinone and substituted derivatives, like 2-cholor-1,4-benzoquinone, 1,2-benzoquinone and its substituted derivatives, diaryl-ketones like benzophenone derivatives, alkyl-aryl ketones like acetophenone and derivatives, optionally having electron withdrawing or electron donating functional groups and mixtures thereof. Other suitable aromatic ketones include acetophenone, ethyl phenyl ketone, and diphenyl ketone, benzophenone, 2,2-dimethoxy-2-phenylacetophenone, dimethoxyacetophenone, xanthone, thioxanthone, p-methylacetophenone, propiophenone, 1-phenyl-1-butanone, isopropylphenylketone, benzaldehyde, o-hydroxybenzaldehyde, m-hydroxybenzaldehyde, p-hydroxybenzaldehyde, benzylmethylketone, their derivatives, and mixtures thereof. Also suitable for use may be cyclic ketones, such as cyclobutanone, cyclopentanone, cyclohexanone, heptanone, methylcyclohexanone, cyclooctanone, cyclononanone, cyclodecanone, cycloundecanone, cyclododecanone, cyclotridecanone, and the like.

Because water is generated as a by-product in the reaction between the base and the coupling agent, heat can be applied to the imaged print substrate to remove the formed water.

It will be appreciated that with the suitable selection of coupling agent or a mixture of coupling agents, it is possible to produce any color in the image forming medium. For example, suitable coupling agents can be selected to provide colors ranging from yellow, to red, to blue, to cyan, to purple. Furthermore, combinations of two or more coupling agents may be used to provide a wider range of colors. For example, black or full color images can be provided by selecting combinations of coloring agents that provide cyan, magenta, and yellow colors.

Photobase generators and coupling agents are usually effective when present in small amounts in the image forming compositions of the disclosure, but their content is not particularly limited. For example, in embodiments, the photobase generators and coupling agents are each generally present in amounts of from about 0.01% to about 20% by weight, such as from about 0.5% to about 10% by weight or from about 0.8% to about 8% by weight, of the total dry weight of the composition (i.e., excluding any volatile solvents used for applying the composition).

The image forming materials (photobase generator and coupling agent) may be dispersed in any suitable carrier, such as solvent, polymer binder, or the like. Suitable solvents include, for example, straight chain aliphatic hydrocarbons, branched chain aliphatic hydrocarbons, and the like, such as where the straight or branched chain aliphatic hydrocarbons have from about 1 to about 30 carbon atoms. For example, a non-polar liquid of the ISOPAR™ series (manufactured by the Exxon Corporation) may be used as the solvent. These hydrocarbon liquids are considered narrow portions of isoparaffinic hydrocarbon fractions. For example, the boiling range of ISOPAR G™ is from about 157° C. to about 176° C.; ISOPAR H™ is from about 176° C. to about 191° C.; ISOPAR K™ is from about 177° C. to about 197° C.; ISOPAR L™ is from about 188° C. to about 206° C.; ISOPAR M™ is from about 207° C. to about 254° C.; and ISOPAR V™ is from about 254.4° C. to about 329.4° C. Other suitable solvent materials include, for example, the NORPAR™ series of liquids, which are compositions of n-paraffins available from Exxon Corporation, the SOLTROL™ series of liquids available from the Phillips Petroleum Company, and the SHELLSOL™ series of liquids available from the Shell Oil Company. Mixtures of one or more solvents, i.e., a solvent system, can also be used, if desired. In addition, more polar solvents can also be used, if desired. Examples of more polar solvents that may be used include halogenated and nonhalogenated solvents, such as tetrahydrofuran, trichloro- and tetrachloroethane, dichloromethane, chloroform, monochlorobenzene, toluene, xylenes, acetone, methanol, ethanol, xylenes, benzene, ethyl acetate, dimethylformamide, cyclohexanone, N-methyl acetamide and the like. The solvent may be composed of one, two, three or more different solvents. When two or more different solvents are present, each solvent may be present in an equal or unequal amount by weight ranging for example from about 5% to 90%, particularly from about 30% to about 50%, based on the weight of all solvents.

Both compositions dispersable in either organic polymers or waterborne polymers can be used, depending on the used components. For example, for waterborne compositions, polyvinylalcohol is a suitable application polymer, and polymethylmethacrylate is suitable for organic soluble compositions.

Suitable examples of polymeric binders include, but are not limited to, polyalkylacrylates like polymethyl methacrylate (PMMA), polycarbonates, polyethylenes, oxidized polyethylene, polypropylene, polyisobutylene, polystyrenes, poly (styrene)-co-(ethylene), polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohol, polyacrylic acid, and the like. Copolymer materials such as polystyrene-acrylonitrile, polyethylene-acrylate, vinylidenechloride-vinylchloride, vinylacetate-vinylidene chloride, styrene-alkyd, poly(methacrylic acid), poly[1-2-(hydroxyethyl)aziridine0], Poly(N-hydroxyethyl)ethyleneimine, poly(ethyleneimine), poly (N-acetyl)ethyleneimine, poly(acrylamide), poly allylamine, poly (sodium styrene sulfonate) resins are also examples of suitable binder materials. The copolymers may be block, random, or alternating copolymers. In some embodiments, polymethyl methacrylate or a polystyrene is the polymer binder, in terms of their cost and wide availability.

In embodiments, the imaging composition can be applied in one form, and dried to another form for use. Thus, for example, the imaging composition comprising photobase generator, coupling agent, and polymer particles may be dissolved or dispersed in a solvent for application to or impregnation into a substrate, with the solvent being subsequently evaporated to form a dry layer.

In general, the imaging composition can include the carrier and imaging material in any suitable amounts, such as from about 5 to about 99.5 percent by weight carrier, such as from about 30 to about 70 percent by weight carrier, and from about 0.05 to about 50 percent by weight imaging material, such as from about 0.1 to about 5 percent imaging material by weight.

For applying the imaging layer to the image forming medium substrate, the image forming layer composition can be applied in any suitable manner. For example, the image forming layer composition can be mixed and applied with any suitable solvent or polymer binder, and subsequently hardened or dried to form a desired layer. Further, the image forming layer composition can be applied either as a separate distinct layer to the supporting substrate, or it can be applied so as to impregnate into the supporting substrate.

The image forming medium may comprise a supporting substrate, coated or impregnated on at least one side with the imaging layer. As desired, the substrate can be coated or impregnated on either only one side, or on both sides, with the imaging layer. When the imaging layer is coated or impregnated on both sides, or when higher visibility of the image is desired, an opaque layer may be included between the supporting substrate and the imaging layer(s) or on the opposite side of the supporting substrate from the coated imaging layer. Thus, for example, if a one-sided image forming medium is desired, the image forming medium may include a supporting substrate, coated or impregnated on one side with the imaging layer and coated on the other side with an opaque layer such as, for example, a white layer. Also, the image forming medium may include a supporting substrate, coated or impregnated on one side with the imaging layer and with an opaque layer between the substrate and the imaging layer. If a two-sided image forming medium is desired, then the image forming medium may include a supporting substrate, coated or impregnated on both sides with the imaging layer, and with at least one opaque layer interposed between the two coated imaging layers. Of course, an opaque supporting substrate, such as conventional paper, may be used in place of a separate supporting substrate and opaque layer, if desired.

Any suitable supporting substrate may be used. For example, suitable examples of supporting substrates include, but are not limited to, glass, ceramics, wood, plastics, paper, fabrics, textile products, polymeric films, inorganic substrates such as metals, and the like. The plastic may be for example a plastic film, such as polyethylene film, polyethylene terephthalate, polyethylene naphthalate, polystyrene, polycarbonate, polyethersulfone. The paper may be, for example, plain paper such as XEROX® 4024 paper, ruled notebook paper, bond paper, silica coated papers such as Sharp Company silica coated paper, Jujo paper, and the like. The substrate may be a single layer or multi-layer where each layer is the same or different material. In embodiments, the substrate has a thickness ranging for example from about 0.3 mm to about 5 mm, although smaller or greater thicknesses can be used, if desired.

When an opaque layer is used in the image forming medium, any suitable material may be used. For example, where a white paper-like appearance is desired, the opaque layer may be formed from a thin coating of titanium dioxide, or other suitable material like zinc oxide, inorganic carbonates, and the like. The opaque layer can have a thickness of, for example, from about 0.01 mm to about 10 mm, such as about 0.1 mm to about 5 mm, although other thicknesses can be used.

If desired, a further overcoating layer may also be applied over the applied imaging layer. The further overcoating layer may, for example, be applied to further adhere the underlying layer in place over the substrate, to provide wear resistance, to improve appearance and feel, and the like. The overcoating layer can be the same as or different from the substrate material, although in embodiments at least one of the overcoating layer and substrate layer is clear and transparent to permit visualization of the formed image. The overcoating layer can have a thickness of, for example, from about 0.01 mm to about 10 mm, such as about 0.1 mm to about 5 mm, although other thicknesses can be used. However, in embodiments, an overcoating layer is not used, so as to allow easy evaporation of water formed during the imaging step, in a post-imaging heating step.

In embodiments where the imaging material is coated on or impregnated into the substrate, the coating can be conducted by any suitable method available in the art, and the coating method is not particularly limited. For example, the imaging material can be coated on or impregnated into the substrate by dip coating the substrate into a solution of the imaging material composition followed by any necessary drying, or the substrate can be coated with the imaging composition to form a layer thereof. Similarly, the protective coating can be applied by similar methods.

In its method aspects, the present disclosure involves providing an image forming medium comprised of a substrate and an imaging layer comprising a photobase generator and a coupling agent, which composition can be dispersed in a polymer as a dry coating onto or into the substrate. The imaged UV light causes the photobase generator to generate a base, such as an amine, which in turn reacts with the coupling agent, such as an aldehyde, to produce a colored image.

In a writing process, the image forming medium is exposed to an imaging light having an appropriate activating wavelength, such as a UV or visible light source such as a light emitting diode (LED), in an imagewise fashion. The imaging light supplies sufficient energy to the photobase generator to cause the photobase generator to generate a base, such as an amine, which in turn reacts with the coupling agent, such as an aldehyde, to produce a colored image at the imaging location. The amount of energy irradiated on a particular location of the image forming medium can affect the intensity or shade of color generated at that location. Thus, for example, a weaker intensity image can be formed by delivering a lesser amount of energy to the location and thus generating a lesser amount of base, while a stronger intensity image can be formed by delivering a greater amount of energy to the location and thus generating a greater amount of base. When suitable coupling agents are selected to provide a black or other colored image, the variation in the amount of energy irradiated on a particular location of the image forming medium can thus allow for formation of grayscale images, while selection of other suitable coupling agents can allow for formation of full color images.

The imaging light used to form the transient image may have any suitable predetermined wavelength scope such as, for example, a single wavelength or a band of wavelengths. In various exemplary embodiments, the imaging light is an ultraviolet (UV) light having a single wavelength or a narrow band of wavelengths selected from the UV light wavelength range of about 200 nm to about 475 nm, such as a single wavelength at about 365 nm or a wavelength band of from about 360 nm to about 370 nm. For forming the image, the image forming medium may be exposed to the imaging light for a time period ranging from about 10 milliseconds to about 5 minutes, particularly from about 30 milliseconds to about 1 minute. The imaging light may have an intensity ranging from about 0.1 mW/cm$^2$ to about 100 mW/cm$^2$, particularly from about 0.5 mW/cm$^2$ to about 10 mW/cm$^2$.

In various exemplary embodiments, imaging light corresponding to the predetermined image may be generated for example by a computer or a Light Emitting Diode (LED) array screen and the image is formed on the image forming medium by placing the medium on or in proximity to the LED screen for the desired period of time. In other exemplary embodiments, a UV Raster Output Scanner (ROS) may be used to generate the UV light in an image-wise pattern. This embodiment is particularly applicable, for example, to a printer device that can be driven by a computer to generate printed images in an otherwise conventional fashion. That is, the printer can generally correspond to a conventional inkjet printer, except that the inkjet printhead that ejects drops of ink in the imagewise fashion can be replaced by a suitable UV light printhead that exposes the image forming medium in an imagewise fashion. In this embodiment, the replacement of ink cartridges is rendered obsolete, as writing is conducted using a UV light source. Other suitable imaging techniques that can be used include, but are not limited to, irradiating a UV light onto the image forming medium through a mask, irradiating a pinpoint UV light source onto the image forming medium in an imagewise manner such as by use of a light pen, and the like.

Because water is generated as a by-product in the reaction between the base and the coupling agent, a post-imaging heating step may be applied to the imaged print substrate. The heating step can be employed to evaporate or drive off some or all of the generated water. Remaining water can cause a reverse reaction to occur, and thus water is desirably evaporated from the imaged print substrate. Such a heating step can be conducted in any suitable manner and using any suitable heating device, such as a radiant heater, heated pressure rollers, or the like, where the imaged print substrate is heated to a temperature of from about 100° C. to about 300° C. or more, such as from about 100° C. or about 110° C. or about 120° C. to about 150° C. or about 175° C. or about 200° C. The heating can be for any suitable and desired time, with a heating time of about 50 milliseconds to about 10 seconds generally being sufficient.

In embodiments, the image formed by the exposure to UV light is permanent, much like a conventional ink printed document. That is, the reaction of the formed base with the coupling agent is not reversible in the image forming medium, and thus the image can not be erased by a reverse reaction. However, it is envisioned that suitable selection of the photobase generator and coupling agent may be selected such that the reaction can be reversed and the image erased, such as by application of heat, light, or the like.

According to various exemplary implementations, the color contrast that renders the image visible to an observer may be a contrast between, for example two, three or more different colors. The term "color" may encompass a number of aspects such as hue, lightness and saturation, where one color may be different from another color if the two colors differ in at least one aspect. For example, two colors having the same hue and saturation but are different in lightness would be considered different colors. Any suitable colors such as, for example, red, white, black, gray, yellow, cyan, magenta, blue, and purple, can be used to produce a color contrast as long as the image is visible to the naked eye of a user. However, in terms of desired maximum color contrast, a desirable color contrast is a dark gray or black image on a light or white background, such as a gray, dark gray, or black image on a white background, or a gray, dark gray, or black image on a light gray background.

In various exemplary embodiments, the color contrast may change such as, for example, diminish during the visible time, but the phrase "color contrast" may encompass any degree of color contrast sufficient to render an image discernable to a user regardless of whether the color contrast changes or is constant during the visible time.

An example is set forth hereinbelow and is illustrative of different compositions and conditions that can be utilized in practicing the disclosure. All proportions are by weight unless otherwise indicated. It will be apparent, however, that the disclosure can be practiced with many types of compositions and can have many different uses in accordance with the disclosure above and as pointed out hereinafter.

EXAMPLES

Example 1

White Background Cyan Image

An image forming medium is made by coating an imaging composition on a paper substrate. The imaging composition is formed by mixing 2-chloro-1,4-benzoquinone as a coupling agent and O-acyloxime as photobase generator in a solution containing polymethylmethacrylate dissolved in tetrahydrofuran as a solvent. Xerox 4024 white paper is coated with this solution by using a blade, with a gap of 5 mils. The paper is allowed to dry in room conditions or is heated at about 50° C. for faster evaporation. The components in the coating layer react under UV exposure as follow:

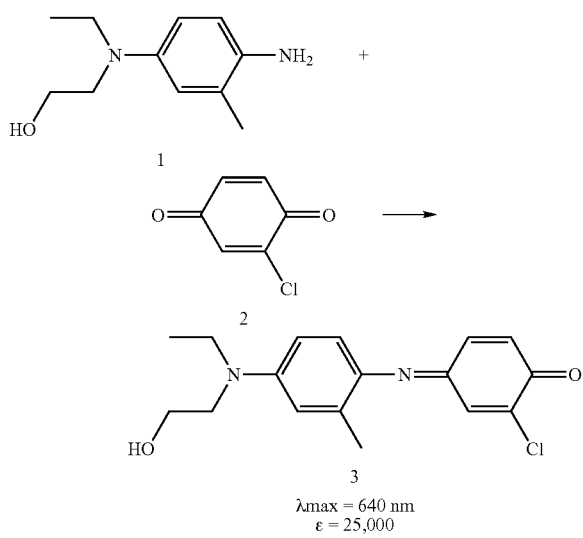

λmax = 640 nm
ε = 25,000

Initially, the paper is white (no Schiff base present). Exposure to UV light generate the amine. The UV light is produced from an UV LED printbar. The UV exposure generates the amine (1), which reacts with coupling agent (2) to produce the Schiff base compound (3) responsible for the cyan coloration. The printed image is stable (permanently printed) on the paper.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. An image forming medium, comprising
   a substrate; and
   an imaging layer coated on or impregnated into said substrate, wherein the imaging layer comprises:
   a photobase generator, and
   a coupling agent,
   wherein the photobase generator and the coupling agent are selected so that irradiation of the imaging layer causes said photobase generator to generate a base that reacts with the coupling agent to produce a permanent printed image.

2. The image forming medium of claim 1, wherein the imaging layer further comprises a film-forming medium, and said photobase generator and said coupling agent are dispersed in the film-forming material.

3. The image forming medium of claim 2, wherein the film-forming medium is selected from the group consisting of a solvent, a polymer binder, microcapsules, a liquid crystal material, and a matrix material.

4. The image forming medium of claim 2, wherein the film-forming medium is a polymer binder selected from the group consisting of polyalkylacrylates, polycarbonates, polyethylenes, oxidized polyethylene, polypropylene, polyisobutylene, polystyrenes, poly(styrene)-co-(ethylene), polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohol, polyacrylic acid, polystyrene-acrylonitrile, polyethylene-acrylate, vinylidenechloride vinyichloride, vinylacetate-vinylidene chloride, styrene-alkyd resins, poly(methacrylic acid), poly[1-2-(hydroxyethyl)aziridine0], Poly(N-hydroxyethyl)ethyleneimine, poly(ethyleneimine), poly (N-acetyl) ethyleneimine, poly(acrylamide), poly allylamine, poly (sodium styrene sulfonate) and mixtures thereof.

5. The image forming medium of claim 1, wherein the photobase generator is selected from the group consisting of o-acyloximes, benzoyloxycarbonyl derivatives, photoactive carbamates, oxime ester compounds, ammonium compounds, benzoin compounds, dimethoxybenzyl urethane compounds, orthonitrobenzyl urethane compounds, aromatic sulfonamides, alpha-lactams, N-(2-arylethenyl) amides, N-substituted 4-(o-nitrophenyl)dihydroxypyridines, N-(2-nitrobenzyloxycarbonyl)piperidine, 1,3-bis(N-(2-nitrobenzyloxycarbonyl)-4-piperidyl]propane, N,N'-bis(2-nitrobenzyloxycarbonyl)dihexylamine, and O-benzylcarbonyl-N-(1-phenylethylidene)hydroxylamine, and mixtures thereof.

6. The image forming medium of claim 1, wherein the irradiation causes the base and the coupling agent to react to form a Schiff base.

7. The image forming medium of claim 1, wherein the coupling agent is selected from the group consisting of aldehydes, ketones, and mixtures thereof.

8. The image forming medium of claim 1, wherein the coupling agent is selected from the group consisting of aryl aldehydes, alkyl aldehydes, arylalkyl aldehydes, 1,2 or 1,4 quinones, cyclic ketones, diaryl ketones, and aryl-alkyl ketones, each optionally substituted with functional groups like alkyl radicals, electron withdrawing groups or with electron donating functional groups.

9. The image forming medium of claim 1, wherein the coupling agent provides an imaging layer that is colorless prior to exposure to irradiation and is colored after irradiation.

10. The image forming medium of claim 1, wherein the photobase generator and the coupling agent are selected such that said image is selected from the group consisting of a monochrome image, a grayscale image, and a multicolor image.

11. The image forming medium of claim 1, wherein the irradiation causes said photobase generator to generate an amine, ammonia, or a hydroxyl ion.

12. The image forming medium of claim 1, wherein the imaging layer further comprises a photosensitizer.

13. The image forming medium of claim 1, wherein the photobase generator and the coupling agent is each present in an amount of from about 0.01% to about 20% by weight of a total dry weight of the imaging layer.

14. The image forming medium of claim 1, wherein the substrate is selected from the group consisting of glass, ceramic, wood, plastic, paper, fabric, textile, metals, plain paper, and coated paper.

15. A method of making an image forming medium, comprising applying an imaging layer composition to a substrate, wherein the imaging layer composition comprises:
    a photobase generator, and
    a coupling agent,
    wherein the photobase generator and the coupling agent are selected so that irradiation of the imaging layer composition causes said photobase generator to generate a base that reacts with the coupling agent to produce a permanent printed image.

16. The method of claim 15, wherein the applying comprises coating the imaging layer over the substrate or impregnating the imaging layer into the substrate.

17. The method of claim 15, wherein the imaging layer composition further comprises a film-forming polymer binder.

18. A method of forming an image, comprising:

provinding an image forming medium comprising:

a substrate; and an imaging layer coated on or impregnated into said substrate, wherein the imaging layer comprises a photobase generator and a coupling agent;

exposing the image forming medium to UV irradiation in an imagewise manner, wherein the photobase generator and the coupling agent are selected so that said UV irradiation causes said photobase generator to generate a base that reacts with the coupling agent to produce a permanent printed image.

19. The method of claim 18, wherein the exposing is for a time period ranging from about 10 milliseconds to about 5 minutes at an intensity ranging from about 0.1 mW/cm$^2$ to about 100 mW/cm$^2$.

20. The method of claim 18, further comprising heating the image forming medium after said exposing to evaporate water formed during the exposing step.

21. An imaging system, comprising:

the image forming medium of claim 1; and a printer comprising a UV irradiation source for printing on the image forming medium in an imagewise manner.

22. The image forming medium of claim 1, wherein the image forming medium is an inkless printing paper.

23. The image forming medium of claim 1, wherein the imaging layer is configured to form cyan, magenta, and yellow colors.

* * * * *